United States Patent
Smerzi et al.

(10) Patent No.: US 11,837,558 B2
(45) Date of Patent: Dec. 5, 2023

(54) PROCESS FOR MANUFACTURING A STRAINED SEMICONDUCTOR DEVICE AND CORRESPONDING STRAINED SEMICONDUCTOR DEVICE

(71) Applicant: STMICROELECTRONICS S.r.l., Agrate Brianza (IT)

(72) Inventors: Santo Alessandro Smerzi, Catania (IT); Michele Calabretta, Giarre (IT); Alessandro Sitta, Giardini Naxos (IT); Crocifisso Marco Antonio Renna, Floridia (IT); Giuseppe D'Arrigo, San Giovanni la Punta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 17/372,115

(22) Filed: Jul. 9, 2021

(65) Prior Publication Data

US 2021/0335730 A1    Oct. 28, 2021

Related U.S. Application Data

(62) Division of application No. 16/389,849, filed on Apr. 19, 2019, now Pat. No. 11,075,172.

(30) Foreign Application Priority Data

Apr. 20, 2018    (IT) .................. 102018000004756

(51) Int. Cl.
  *H01L 23/06*    (2006.01)
  *H01L 23/00*    (2006.01)
  (Continued)

(52) U.S. Cl.
  CPC ............ *H01L 23/564* (2013.01); *H01L 21/52* (2013.01); *H01L 23/06* (2013.01); *H01L 23/14* (2013.01); *H01L 29/7842* (2013.01)

(58) Field of Classification Search
  CPC ................. H01L 29/7842; H01L 21/52; H01L 2924/351; H01L 23/04–057; H01L 23/142
  See application file for complete search history.

(56) References Cited

U.S. PATENT DOCUMENTS 4,965,227 A    10/1990  Chang et al.
5,336,639 A    8/1994   Nagaraj et al.
(Continued)

OTHER PUBLICATIONS

Cho, Young-Kyun et al., "High Performance Power MOSFETs with Strained-Si Channel," Proceedings of the 17th International Symposium on Power Semiconductor Devices & IC's, May 23-26, 2005, Santa Barbara, California, 4 pages.
(Continued)

*Primary Examiner* — Tucker J Wright
(74) *Attorney, Agent, or Firm* — SEED INTELLECTUAL PROPERTY LAW GROUP LLP

(57) ABSTRACT

A process for manufacturing a strained semiconductor device envisages: providing a die of semiconductor material, in which elementary components of the semiconductor device have been integrated by means of initial front-end steps; and coupling, using the die-attach technique, the die to a support, at a coupling temperature. The aforesaid coupling step envisages selecting the value of the coupling temperature at a value higher than an operating temperature of use of the semiconductor device, and moreover selecting the material of the support so that it is different from the material of the die in order to determine, at the operating temperature, a coupling stress that is a function of the different values of the coefficients of thermal expansion of the materials of the die and of the support and of the temperature difference between the coupling temperature and the operating temperature. Furthermore, additional stress can be enhanced by means of different embodiments involving the support, such as ring or multi-layer frame.

19 Claims, 6 Drawing Sheets

(51) Int. Cl.
  *H01L 21/52* (2006.01)
  *H01L 23/14* (2006.01)
  *H01L 29/78* (2006.01)

(56) References Cited

U.S. PATENT DOCUMENTS

| | | | |
|---|---|---|---|
| 6,081,037 A * | 6/2000 | Lee | H01L 23/13 |
| | | | 257/E21.511 |
| 7,723,720 B2 | 5/2010 | Nishida et al. | |
| 8,237,195 B2 | 8/2012 | Ngai et al. | |
| 2006/0043579 A1 | 3/2006 | He et al. | |
| 2006/0099772 A1 | 5/2006 | Yu et al. | |
| 2006/0244105 A1 | 11/2006 | Forbes et al. | |
| 2011/0097893 A1 | 4/2011 | Jeng et al. | |
| 2014/0151866 A1 | 6/2014 | Otremba | |
| 2019/0051617 A1 | 2/2019 | Seebacher et al. | |

OTHER PUBLICATIONS

Kanda, Yozo, "A Graphical Representation of the Piezoresistance Coefficients in Silicon," IEEE Transactions on Electron Devices (29)1:64-70, Jan. 1982.

Liu, Chee Wee et al., "Mobility-Enhancement Technologies: Recent progress using new materials, process-induced strain, and package strain," IEEE Circuits & Devices Magazine, May/Jun. 2005, pp. 21-36.

Phan, Hoang-Phuong et al., "The Piezoresistive Effect of SiC for MEMS Sensors at High Temperatures: A Review", Journal of Microelectromechanical Systems, 24(6):1663-1677, Dec. 2015.

Punetha, Mayank, et al., "A Vertical Super-Junction Strained-Silicon Channel Power MOSFET", Tencon 2015—2015 IEEE Region 10 Conference, 4 pages.

* cited by examiner $T = T_p$ $T = T_c$ $T = T_o$

PROCESS FOR MANUFACTURING A STRAINED SEMICONDUCTOR DEVICE AND CORRESPONDING STRAINED SEMICONDUCTOR DEVICE

BACKGROUND

Technical Field

The present solution relates to a process for manufacturing a semiconductor device subjected to stresses or strains (so-called strained device) and to a corresponding strained semiconductor device.

The technique is known of subjecting to mechanical stresses or strains semiconductor devices (such as MOSFETs and power devices) in order to improve the electrical performance thereof, for example in terms of: electron-hole mobility, drain current in saturation and in the linear region, on-state current $I_{on}$, on-state resistance $R_{DSon}$, DC operating characteristics.

Description of the Related Art

In general, three types of techniques are used for obtaining strained semiconductor devices: techniques based on substrate-level stress; techniques based on the manufacturing process; and techniques based on external mechanical stresses.

Techniques based on substrate-level stress envisage generation of stresses, for example, compressive or tensile stresses, over the entire die of a semiconductor device, exploiting differences in the crystal-lattice constant of different semiconductor materials. Known solutions envisage, for example, growth of a thin film of a silicon-germanium (SiGe) crystal on a silicon (Si) structural layer, for generation of biaxial compressive stresses, or formation of a thin silicon (Si) film on a structural layer constituted by a silicon-germanium (SiGe) crystal, for generation of biaxial tensile stresses.

Disadvantages of the above techniques are in general the costs and manufacturing complexity and the absence of scalability of the size of the resulting devices.

Techniques based on the manufacturing process envisage local generation of stresses for each integrated elementary component, for example a single MOSFET, provided in the die, for instance, by generating uniaxial tensile or compressive stresses in the channel region of the individual MOSFET. For this purpose, for example, a silicon-nitride ($Si_3N_4$) or silicide layer may be deposited above the gate region of the MOSFET, for generating compressive stresses in the channel region; alternatively, insulation trenches of a STI (Shallow Trench Insulation) type may be provided alongside the channel, or else the source and drain regions of the MOSFET may be made of silicon-germanium (in the case of a silicon die).

The above techniques associated to the manufacturing process are advantageous only for devices with small channel lengths (for example, in the region of 100 nm) and moreover require major modifications to the corresponding process flow.

In particular, both the techniques based on the substrate-level stress and the techniques associated to the manufacturing process have the limitation of requiring additional steps in the manufacturing process at the front-end (FE) level, i.e., during the initial manufacturing steps of the semiconductor device and of the corresponding integrated elementary components (for example, during the manufacturing steps of the corresponding transistors).

The techniques based on external mechanical stresses are not affected by the above disadvantage, in so far as they do not interfere with the front-end steps of manufacture of the semiconductor device, for example, intervening at the end of the manufacturing steps of the corresponding integrated elementary components (for example, transistors), thus not requiring modifications to the corresponding process flow.

Known techniques based on external mechanical stresses envisage, for example, application of uniaxial or biaxial stresses, by means of bending of the wafer of the semiconductor device at the end of the steps of manufacture of the integrated elementary components, for example by means of bending methods of the so-called four-point bending type.

The above techniques may, however, for the most part be used in the laboratory, during characterization, and are not suited for manufacturing of the semiconductor devices on an industrial scale.

Other known techniques based on external mechanical stresses are, for example, described in US 2006/0244105 A1 or in US 2006/099772 A1, and envisage thinning out the wafer or die of the semiconductor device (at the end of the steps of manufacture of the corresponding integrated elementary components) and then attaching the same wafer or die on a bent substrate so as to generate a planar strain.

In general, current known techniques based on external mechanical stresses are not, however, compatible with the final steps (the so-called back-end, BE, steps) of manufacture of the semiconductor devices, i.e., with the steps of manufacturing of a corresponding package (these steps envisaging, for example, coupling of the die to a support or frame, the so-called leadframe, having leads for electrical connection towards the outside, and subsequent packaging of the die in a resin or ceramic coating). Basically, these techniques cannot be used for manufacturing packaged semiconductor devices. Moreover, these techniques in general do not allow to maintain the substrate, wafer, or die of the semiconductor devices in a situation of permanent or lasting stress.

BRIEF SUMMARY

At least one embodiment of the present disclosure provides a solution for generation of stresses in a semiconductor device that will enable at least one drawback of the known art to be overcome.

According to the present disclosure, a process for manufacturing a strained semiconductor device and a corresponding strained semiconductor device are consequently provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

As will be clarified in detail hereinafter, the present solution envisages manufacturing a strained semiconductor device, using, for generation of the stresses, back-end process steps, which are altogether compatible with packaging of the semiconductor device.

In particular, one aspect of the present solution envisages generation of stresses in a die of the semiconductor device (in which the corresponding integrated elementary components, for example, transistors, have been previously provided by means of front-end steps of the manufacturing process, of a known type, not described in detail herein) by exploiting a step of coupling or attaching, the so-called die attach, to a support, or frame (this step may advantageously be part of the back-end process for manufacturing of the package of the semiconductor device).

This coupling step generates in the die, at an operating temperature of use of the semiconductor device (for example, comprised in a range of values between −40° C. and +150° C.), a substantially planar stress. This stress is due to a difference between the aforesaid operating temperature and the temperature at which the coupling step occurs (for example, of between 350° C. and 400° C.) and to the different values of the coefficient of thermal expansion (CTE) of the materials of the die and the support, which cause a different contraction/expansion of the same materials.

Figure 1A:
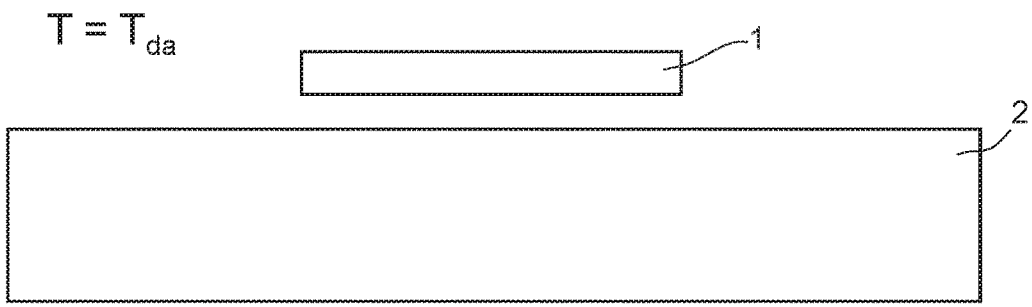
FIGS. 1A-1C show consecutive steps of a process for manufacturing a strained semiconductor device, according to a first embodiment of the present solution.

As shown schematically in FIG. 1A, the die 1 of the semiconductor device, made of a crystalline semiconductor material, such as silicon or germanium, is coupled to a support 2 (which may, for example, be a leadframe of a corresponding package, or any support or frame) by means of a die-attach technique, at a coupling temperature $T_{da}$; the support 2 may, for example, be made of metal material, such as aluminum, brass, or copper.

Figure 1B:
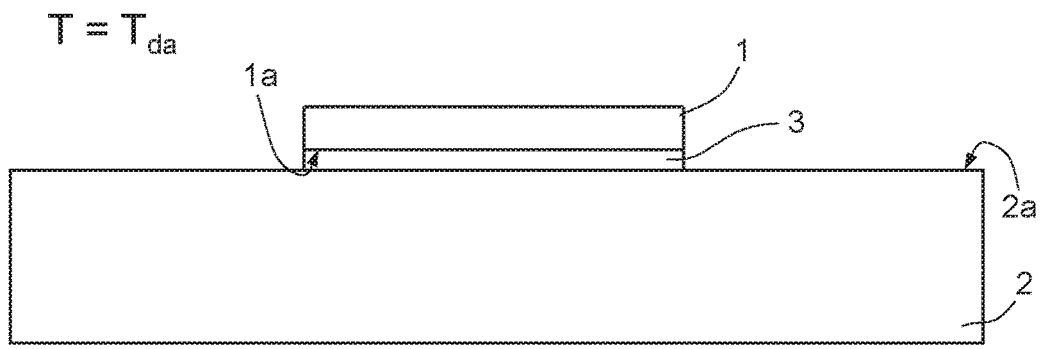

The coupling step results in attaching of the die 1 to the support 2, as illustrated in FIG. 1B, by means of a coupling material layer 3, which is formed between a bottom surface 1a of the die and a facing top surface 2a of the support 2. At the coupling temperature $T_{da}$, the semiconductor device may be considered substantially free from mechanical stresses.

Figure 1C:
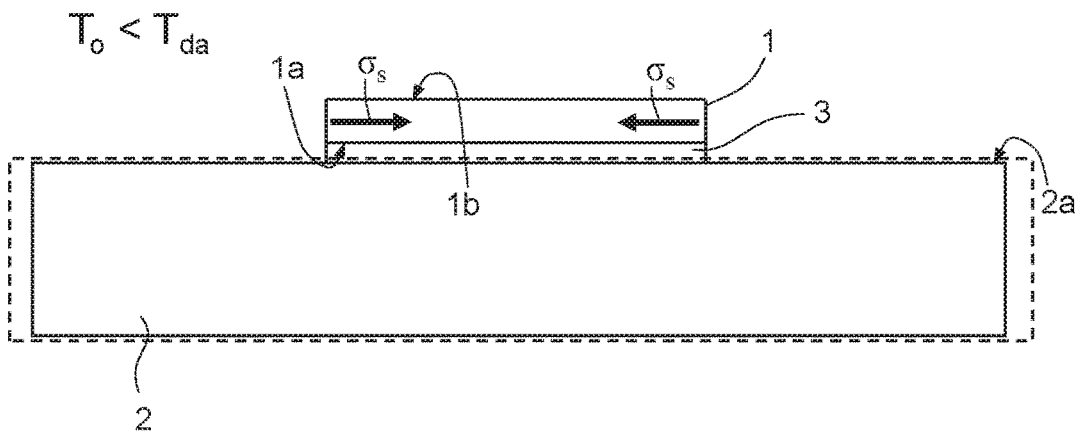

Instead, at an operating temperature $T_o$ of use of the semiconductor device, generally much lower than the coupling or die-attach temperature $T_{da}$, the die 1 and the corresponding semiconductor device are subjected to a stress, caused by the different coefficients of thermal expansion of the die 1 and of the support 2, i.e., by the different contraction/expansion of the corresponding materials as the temperature varies. In the example illustrated schematically in FIG. 1C, the support 2 undergoes a reduction in volume with respect to the initial condition (represented by a dashed line).

In particular, the temperature difference ΔT between the coupling temperature $T_{da}$ and the operating temperature $T_o$ is preferably comprised between 150° C. and 400° C.

The resulting stress, denoted by $\sigma_s$ and referred to as "coupling stress", is substantially planar and biaxial (acting in a horizontal plane parallel to the bottom surface 1a and to a top surface 1b of the die 1). As is known, a biaxial compressive stress is particularly advantageous for N-channel devices of a vertical type, such as power MOSFETs or IGBTs; for example, such stress, as a result of the piezoresistive effect, causes a decrease in the on-state resistance $R_{DSon}$ of the semiconductor device.

In order to increase the amount of coupling stress as, in addition to acting on the value of the temperature difference ΔT and on the difference between the CTE coefficients of the materials of the die 1 ($CTE_1$) and of the support 2 ($CTE_2$), a particular aspect of the present solution envisages the use of so-called hard die-attach techniques, which lead to definition, for example by means of diffusion-soldering or sintering techniques, of a coupling material layer 3 having high hardness and stiffness characteristics.

In particular, this coupling material layer 3 has an elastic modulus E comprised between 40 GPa and 200 GPa, and a Poisson's ratio ν comprised between 0.1 and 0.4.

Consequently, the coupling material layer 3 transmits in a substantially complete manner the coupling stress $\sigma_s$ to the die 1.

For example, the hard die attach coupling may be implemented via a technique of eutectic diffusion soldering between a gold-tin (Au—Sn) alloy and copper (Cu) at a coupling temperature $T_{da}$ that is very high (360° C.), so as to obtain a coupling material layer 3 that is thin (around a few microns) and has the aforesaid high stiffness characteristics.

In general, the characteristics of the resulting coupling material layer 3 are such as to render permanent the coupling stress as thus generated, throughout the range of operating temperatures $T_o$ at which the semiconductor device can be used.

In detail, the coupling stress as may be expressed by the following relation of proportionality:

$$\sigma_s \alpha (CTE_1 - CTE_2) \cdot (T_{da} - T_o)$$

and can thus be optimized by choosing a high die-attach temperature $T_{da}$ (given the same operating temperature $T_o$) and materials with substantially different coefficients $CTE_1$, $CTE_2$, and moreover by using a coupling material layer 3 with the aforesaid high stiffness characteristics.

A further aspect of the present solution envisages increasing the mechanical stress acting on the die 1 by generating an additional stress that adds, at the operating temperature $T_o$ of use, to the coupling stress $\sigma_s$ deriving from the die attach coupling, thus determining a resulting stress $\sigma_s'$, of a value higher than the coupling stress $\sigma_s$.

Figure 2A:
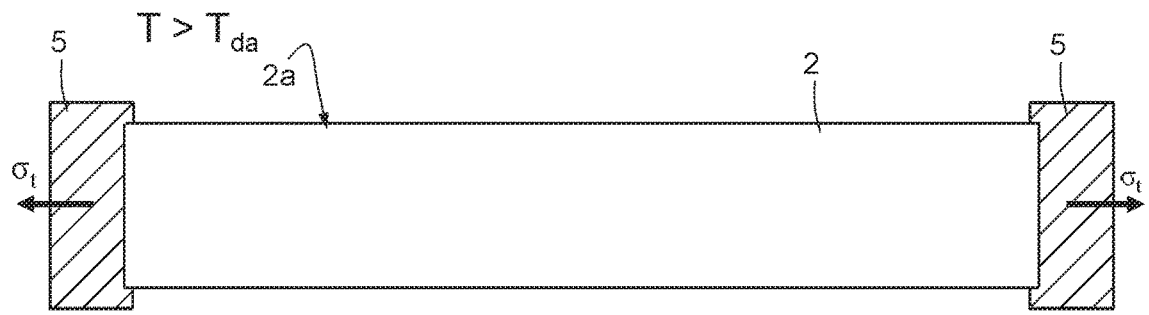
FIGS. 2A-2C show schematic cross-sectional views of a strained semiconductor device, during successive steps of a manufacturing process according to a further embodiment of the present solution.

In a possible embodiment, as illustrated schematically in FIG. 2A, an external mechanical load is applied to the support 2, causing a tensile stress at; in particular, the tensile stress at is in this case generated by clamping opposite longitudinal ends of the support 2 to clamps 5, arranged laterally with respect to the same support 2, and is represented by a uniaxial stress in a longitudinal direction (parallel to the top surface 2a of the support 2).

In particular, the aforesaid external mechanical load is applied at a temperature higher than the coupling temperature $T_{da}$ and determines a pre-tensioning of the die 1, prior to coupling thereof to the support 2 via die attach.

Figure 2B:
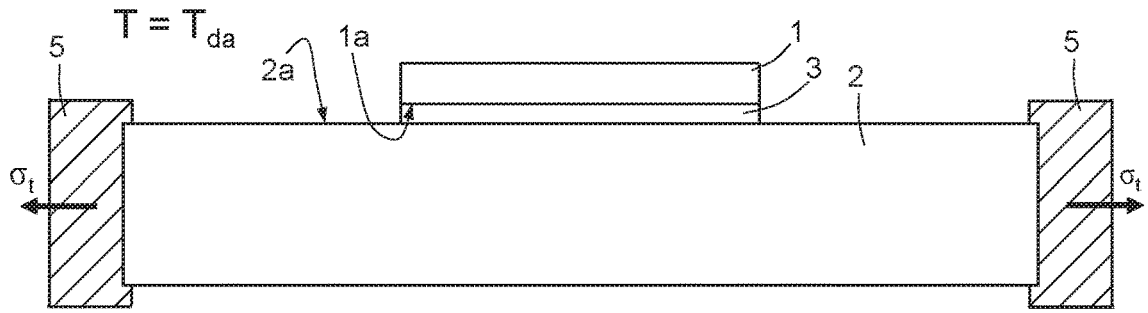

As illustrated in FIG. 2B, the die 1 is then coupled to the support 2, as described previously, by means of the die-attach technique at the coupling temperature $T_{da}$.

Figure 2C:
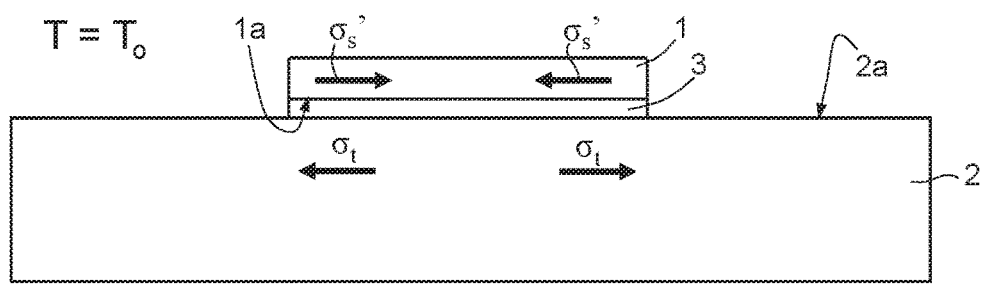

Next, as illustrated in FIG. 2C, the external mechanical load is removed (in the example, the support 2 is released from the clamps 5) so that a strain is generated and an additional compressive stress $\sigma_c$ acting on the die 1 (caused by the relief of tensile stress $\sigma_t$ at which the support 2 had been pre-tensioned).

The die 1 and the support 2 are then brought to the operating temperature $T_o$, lower than the aforesaid coupling temperature $T_{da}$, with the resulting generation, for the reasons previously discussed, of the coupling stress $\sigma_s$; advantageously, the additional stress $\sigma_c$ due to the relief of the external mechanical load thus adds to the coupling stress $\sigma_s$, thus determining the resulting stress $\sigma_s'$ (with $\sigma_s' > \sigma_s$).

In a different embodiment, the additional stress on the die 1 is generated by a housing structure, configured to interact with the die 1 by means of a forced coupling at the operating temperature $T_o$, the presence of an external mechanical load not being required.

In one embodiment, the aforesaid additional stress $\sigma_c$ is exerted directly by the support 2 on the die 1.

Figure 3A:
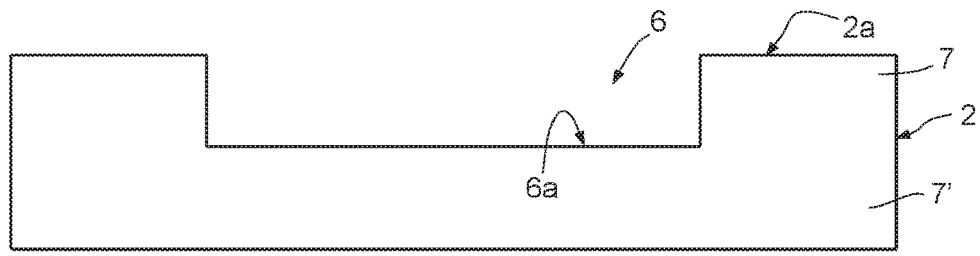
FIGS. 3A-3E show schematic cross-sectional views of a strained semiconductor device, during successive steps of a manufacturing process according to yet a further embodiment of the present solution.

As shown in FIG. 3A, the support 2 defines in this case a housing 6, open towards the outside at its top surface 2a. In other words, the support 2 has a top portion 7, at the aforesaid top surface 2a, that is ring- or collar-shaped and defines inside it side walls of the aforesaid housing 6, and a compact bottom portion 7', which defines a bottom wall 6a of the same housing 6 (the bottom wall 6a defining part of the top surface 2a of the support 2).

Figure 3B:
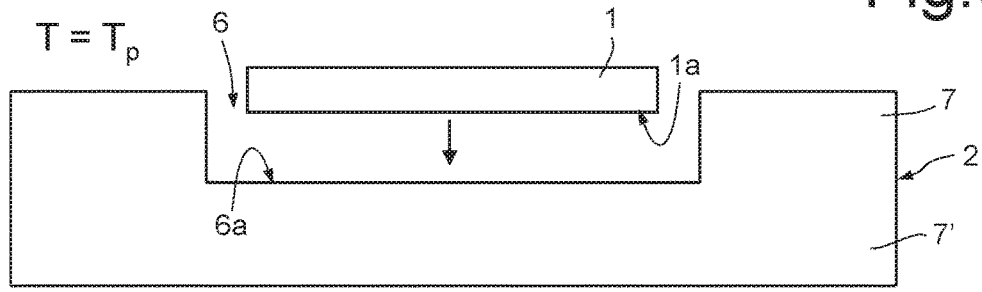

As shown in FIG. 3B, the housing 6 is adapted to house the die 1, which in this case is arranged inside the housing 6 using the so-called pick-and-place technique, at a positioning temperature $T_p$ generally higher than the coupling temperature $T_{da}$ (and in any case not lower than the coupling temperature $T_{da}$).

Figure 4:
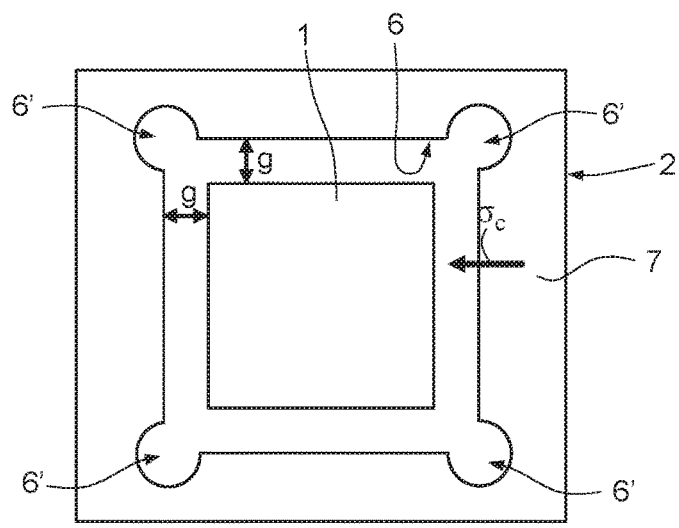
FIG. 4 is a schematic top plan view of the semiconductor device of FIG. 3C.

As shown also in the top plan view of FIG. 4, the housing 6 is larger (in the horizontal plane) than the die 1, with a dimensional tolerance compatible with the aforesaid pick-and-place technique; in particular, a separation gap g, for example of 5-20 µm, is present between the side walls of the housing 6 and the die 1.

Figure 3C:
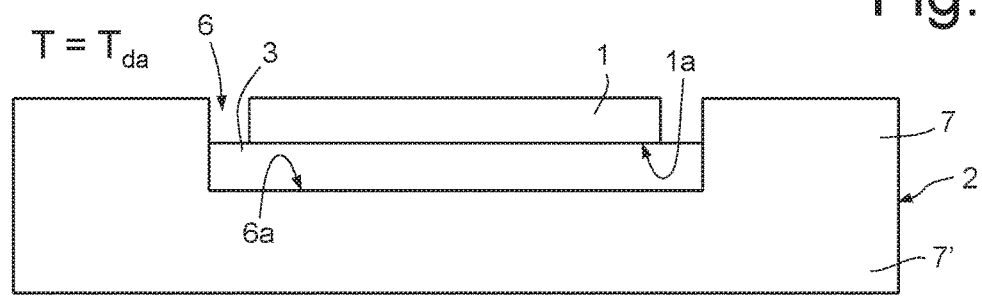

As shown in FIG. 3C, the die 1 and the support 2 are then cooled and brought to the coupling temperature $T_{da}$, at which the die 1 is coupled to the support 2 by means of the die-attach technique, and the aforesaid coupling material layer 3 is formed, in this case interposed between the bottom wall 6a of the housing 6 and the bottom surface 1a of the die 1.

The die 1 and the support 2 are then cooled down to the operating temperature $T_o$, which, for example, coincides with room temperature.

Figure 3D:
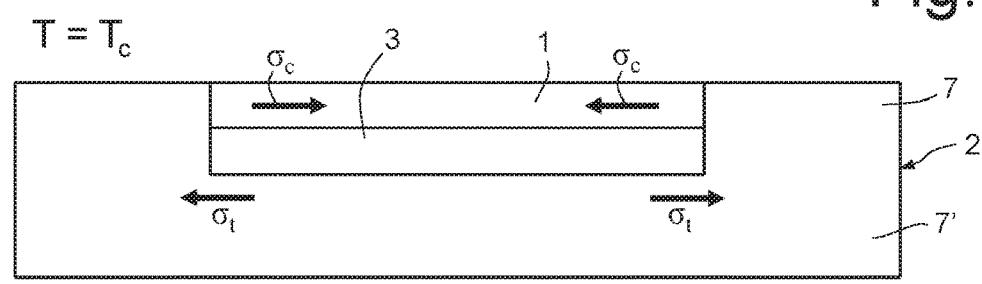

During cooling, due to the higher coefficient of thermal expansion CTE of the support 2 (in particular, of the corresponding top portion 7) as compared to the die 1, the top portion 7 shrinks more than the die 1. Consequently, the gap g decreases progressively, until it becomes zero at a certain temperature $T_c$, intermediate between the coupling temperature $T_{da}$ and the operating temperature $T_o$, at which the top portion 7 of the support 2 comes into contact with the die 1, as shown in FIG. 3D.

Figure 3E:
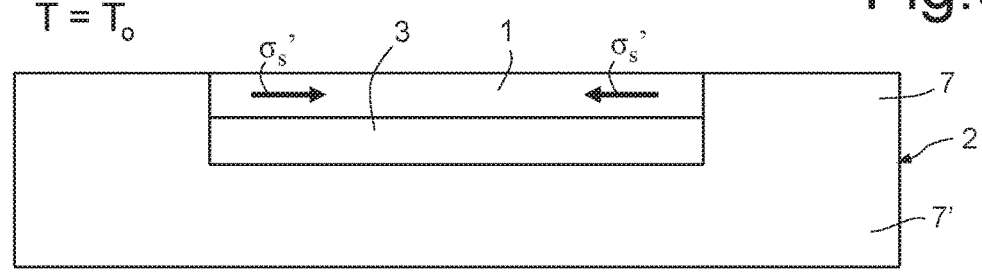

As cooling continues, the top portion 7 is mechanically forced onto the die 1, and consequently a planar compressive stress is generated on the die, which in this case determines the additional compressive stress $\sigma_c$ (and a corresponding tensile stress at in the support 2); this additional stress $\sigma_c$ adds, at the operating temperature $T_o$, to the coupling stress $\sigma_s$, thus determining the resulting stress $\sigma_s'$ as shown in FIG. 3E.

Also in this case, the resulting stress $\sigma_s'$ is thus the combination of two different mechanical sources of stress, with a first contribution due to the die-attach operation and to the temperature difference between the coupling temperature $T_{da}$ and the operating temperature $T_o$ (in addition to the different coefficients of thermal expansion $CTE_1$, $CTE_2$ of the materials), and a second contribution, which adds in a synergistic manner to the first one, due to the compressive stress exerted by the portion of support 2 that is forced onto the die 1.

As shown in the aforesaid FIG. 4, the top portion 7 of the support 2 has, at the corners of the housing 6 (which has a substantially rectangular or square shape in the horizontal plane) empty recesses 6', of a generically circular shape in the horizontal plane, which extend inside the top portion 7 of the support 2, at a distance from the die 1. The presence of said recesses 6' allows to prevent generation, by the support 2, of excessive mechanical stresses at the corners of the die 1, during the aforesaid forced coupling, which might damage the corresponding semiconductor material.

A different embodiment envisages that the aforesaid additional stress $\sigma_c$ is exerted by a frame, distinct from the support 2 and in this case constituting the aforesaid housing structure adapted to exert a forced coupling onto the die 1.

Figure 5A:
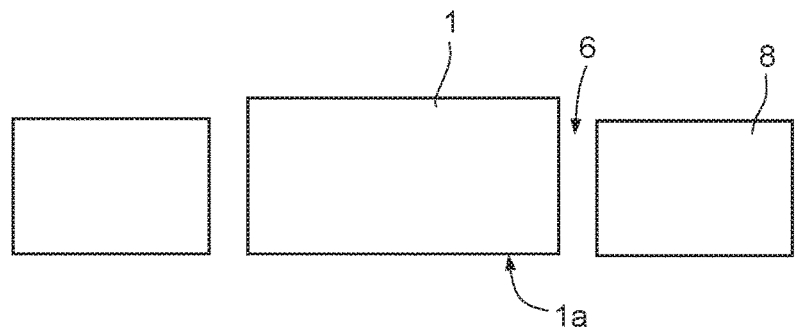
FIGS. 5A-5C show schematic cross-sectional views of a strained semiconductor device, during successive steps of a manufacturing process according to yet a further embodiment of the present solution.

With reference first to FIG. 5A, a frame 8 is thus provided, made, for example, of metal material, such as aluminum, copper, or brass, having a ring or collar conformation and defining inside it a housing, once again designated by 6, inside which the die 1 of the semiconductor device is to be arranged, for example, using the pick-and-place technique (in a way substantially similar to what has been discussed previously; in particular, reference may again be made to the aforesaid FIG. 4 as regards the tolerances and dimensions).

Figure 5B:
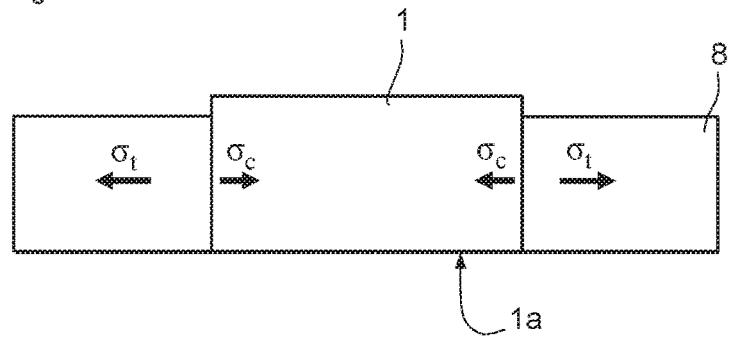

The die 1 is arranged in the housing 6 defined by the frame 8 at the positioning temperature $T_p$ higher than (or equal to) the coupling temperature $T_{da}$, and, then, the temperature is reduced, so as to cause compression of the frame 8 on the die 1 and generate, starting from the contact temperature $T_c$, the additional compressive stress $\sigma_c$, as shown in FIG. 5B.

Figure 5C:
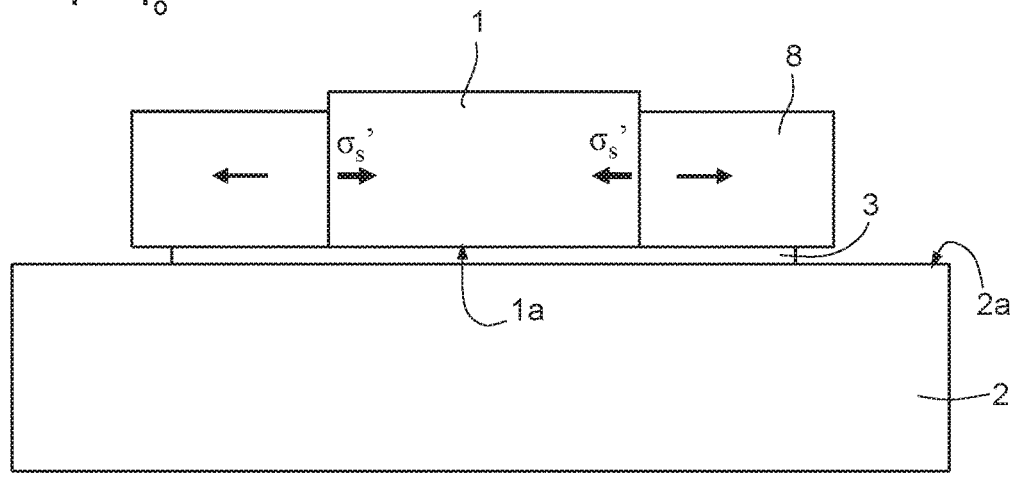

As illustrated in FIG. 5C, the die 1 is also in this case coupled to the support 2, at the coupling temperature $T_{da}$, using the die-attach technique, by means of the coupling material layer 3 interposed between the bottom surface 1a of the die 1 and the top surface 2a of the support 2 (which, in this case, has a planar conformation). As discussed previously, cooling down to the operating temperature $T_o$ entails also in this case generation of the coupling stress $\sigma_s$, which once again adds to the additional stress $\sigma_c$, thus determining the resulting stress $\sigma_s'$ on the die 1.

Figure 6A:
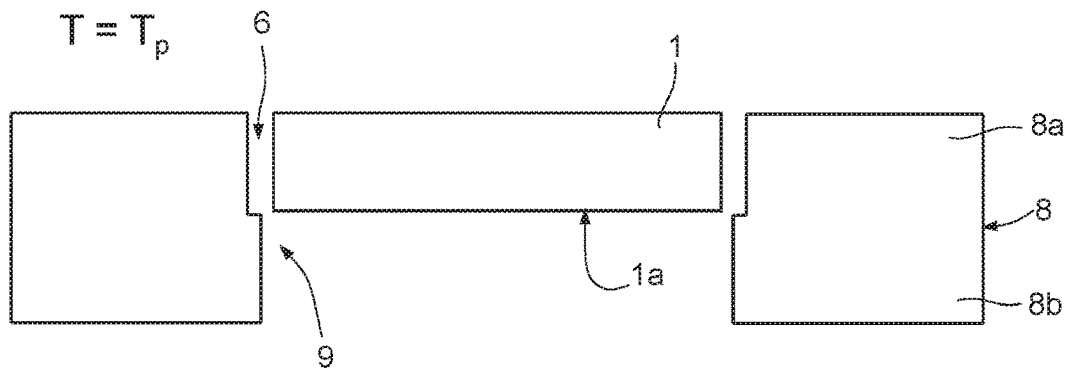
FIGS. 6A-6C show schematic cross-sectional views of a strained semiconductor device, during successive steps of a manufacturing process according to yet a further embodiment of the present solution.

In a variant embodiment, illustrated first with reference to FIG. 6A, the frame 8, which also in this case is made of a metal material, such as aluminum, copper or brass, is constituted by: a top portion 8a that has a ring or collar conformation and defines inside it the housing 6, inside which the die 1 of the semiconductor device is to be arranged using the pick-and-place technique (in a way substantially similar to what has been discussed previously; in particular, see again FIG. 4); and moreover a bottom portion 8b, which defines inside it a cavity 9, which traverses it throughout its thickness and communicates at the top with the aforesaid housing 6 and terminates at the bottom at a bottom surface of the frame 8.

In particular, the cavity 9 has an extension, in the horizontal plane, smaller than that of the housing 6 so that a step is formed between the inner walls of the cavity 9 and the inner walls of the housing 6 (visible in the aforesaid FIG. 6A).

Figure 6B:
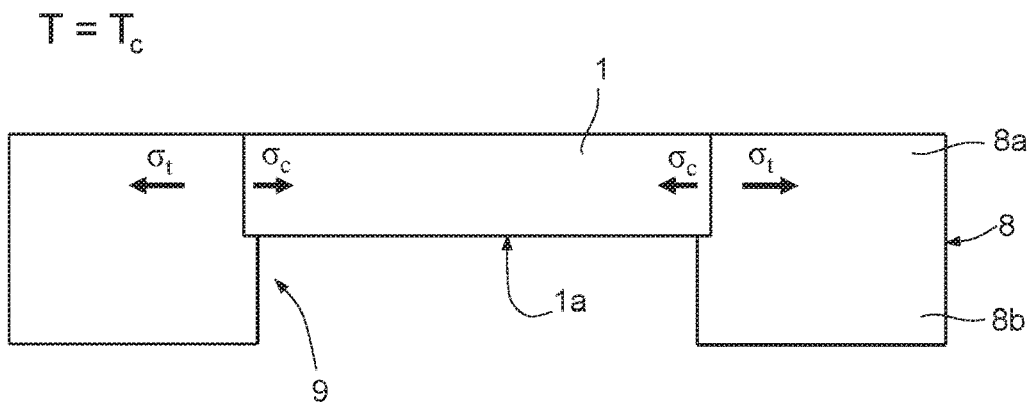

In a manner similar to what has been discussed previously, also in this variant embodiment, the die 1 is arranged in the housing 6 defined by the top portion 8a of the frame 8 at the positioning temperature $T_p$ higher than the coupling temperature $T_{da}$. The temperature is then reduced, so as to determine the forced coupling of the top portion 8a of the frame 8 onto the die 1 and generate the additional stress $\sigma_c$, as shown in FIG. 6B. It should be noted, in particular, that a corner portion of the bottom surface 1a of the die 1 rests on the step defined between the housing 6 and the cavity 9, when the die 1 is forced into contact with the frame 8.

The die 1 is in this case coupled to the support 2, at the coupling temperature $T_{da}$, using the die-attach technique and via formation of the coupling material layer 3 interposed between the bottom surface 1a of the die 1, in this case at the aforesaid step, and the top surface 2a of the support 2.

Figure 6C:
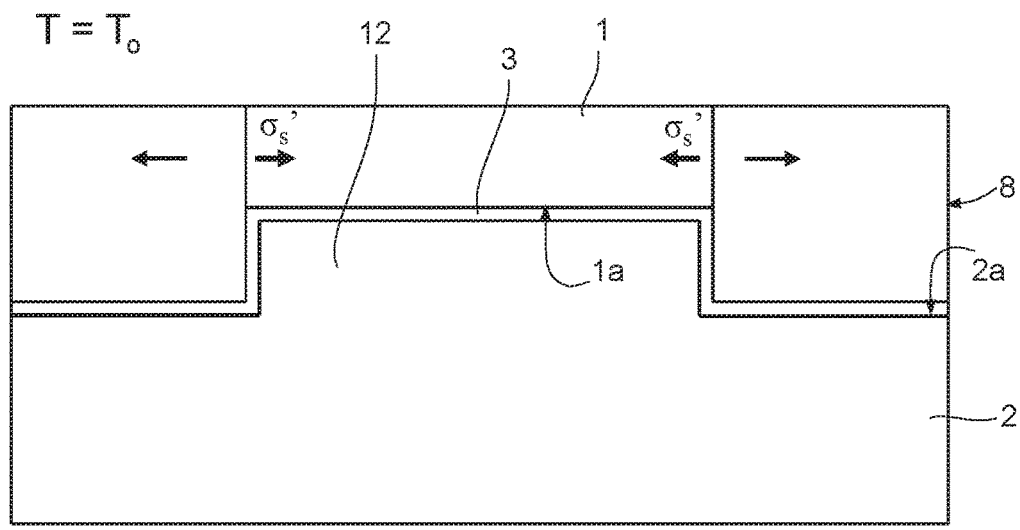

As illustrated in FIG. 6C, and as discussed previously, cooling down to the operating temperature $T_o$ entails also in this case generation of the coupling stress $\sigma_s$, which once again adds to the additional compressive stress $\sigma_c$, thus determining the resulting stress $\sigma_s'$ on the die 1.

It should be noted that, in this embodiment, the support 2 has, at the top surface 2a, a projecting portion 12, adapted to be inserted in the cavity 9 defined inside the bottom portion 8b of the frame 8, for the purpose of attaching to the die 1.

The present Applicant has performed several tests and simulations to verify proper operation of the solution described.

For example, with reference to the embodiment shown in FIGS. 5A-5C, the behavior was simulated with different materials of the frame 8 (aluminum, brass, or copper) and different dimensions of the die 1, considered square in top plan view, with a side of length a.

In particular, the temperature difference $\Delta T$ for forcing the frame 8 onto the die 1 (i.e., for obtaining a zero gap g) was evaluated, starting from the positioning temperature $T_p$, assumed as being 380° C., in this case considering a die 1 having a side of length a of 3 mm.

The table below shows the results of the simulation.

| Material | CTE (ppm/K) | ΔT (° C.) | Tc (° C.) |
|---|---|---|---|
| Aluminum | 23 | 165 | 215 |
| Brass | 19 | 210 | 170 |
| Copper | 17.6 | 225 | 155 |

Aluminum, as a result of having the highest coefficient CTE from among the materials considered, obtains contact between the frame 8 and the die 1 at a smaller temperature difference $\Delta T$. In other words, the contact temperature $T_c$ is highest in the case of aluminum.

In addition, the effect of the size of the die 1 (considering different values of the side a) on the values of the aforesaid temperature difference $\Delta T$ was evaluated, in this case considering a copper frame and again a positioning temperature $T_p$ of 380° C.

The table below, referring to Cu frame, shows the results of the simulation.

| a(mm) | ΔT(° C.) | Tc(° C.) |
|---|---|---|
| 3 | 225 | 155 |
| 4 | 170 | 210 |
| 5 | 135 | 245 |
| 10 | 70 | 310 |

It should be noted in particular that the temperature difference $\Delta T$ decreases (and the value of the contact temperature $T_c$ increases) as the size of the die 1 increases; this result is explained by the fact that the tolerance of the pick-and-place operation is assumed constant (in the example, 10 μm), whereas shrinking due to the temperature (given by the product CTE·ΔT·a) increases as the size of the die 1 increases.

Via simulation, the value of the resulting stress $\sigma_s'$ acting on the die 1 and the resulting reduction of the value of the resistance $R_{DSon}$ were moreover calculated, considering three different materials for the frame 8 (once again aluminum, copper, and brass) and two possible lengths for the side of length a of the die 1 (3 mm and 5 mm).

The table below shows the results of the simulation.

| | 3 mm | | 5 mm | |
|---|---|---|---|---|
| Material | Stress (MPa) | $R_{DSon}$ Variation | Stress (MPa) | $R_{DSon}$ Variation |
| Al | −90 | −4.7% | −120 | −6.3% |
| Cu | −70 | −3.6% | −115 | −6.1% |
| Brass | −80 | −4.2% | −125 | −6.5% |

Considering a die 1 with a side of length a of 3 mm, the aluminum frame 8 generates the highest stress on the die 1 and consequently the greatest variation of $R_{DSon}$ resistance; if the size of the die 1 is increased, instead, $R_{DSon}$ resistance reduction becomes similar for the three considered material.

This result can be explained by the fact that, as the size of the die 1 increases, mechanical forcing of the frame 8 on the die 1 occurs at a greater temperature difference $\Delta T$, and this entails a greater role of the stiffness of the materials (in terms of Young's modulus) in determining the stress induced in the semiconductor material of the die 1.

The advantages of the present solution are clear from the foregoing description.

In any case, it is once again emphasized that the present solution for providing strained semiconductor devices can advantageously be applied at the end of the steps of manufacture of the corresponding integrated elementary components (for example, transistors), without additional steps or modifications in the front end of the manufacturing process being required.

In fact, the present solution envisages exclusively back-end process steps, being moreover altogether compatible with the techniques and steps of packaging of the semiconductor device, and thus suited to industrial manufacturing processes. In a manner that will be evident to a person skilled in the art, these packaging steps may, for example, envisage electrical connection of the die 1 to leads, coating of the die 1 with a packaging material, and so on.

The back-end process steps introduced are simple and do not require a substantial increase in the manufacturing costs.

The mechanical stresses introduced in the die of the semiconductor device, encapsulated in the corresponding package, are moreover permanent.

The above solution may be applied irrespective of the type or technique of manufacturing of the integrated elementary components of the semiconductor device, for example whether they are short-channel or long-channel transistor devices.

Finally, it is clear that modifications and variations may be made to what is described and illustrated herein, without thereby departing from the scope of the present disclosure.

Figure 7:
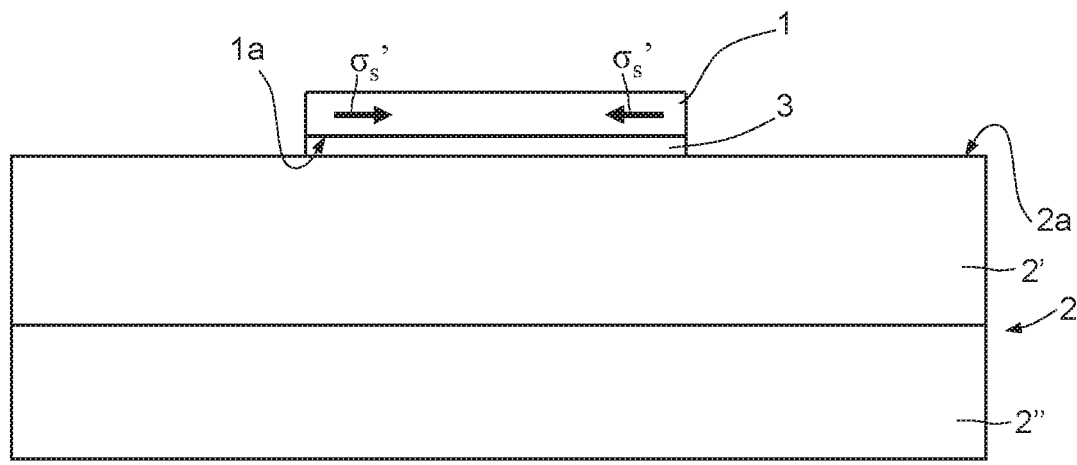
FIGS. 7 and 8 show schematic cross-sectional views of further variant embodiments of the semiconductor device, according to further aspects of the present solution.

For example, a first variant embodiment may envisage, as illustrated in FIG. 7, that the support 2 to which the die 1 of the semiconductor device is coupled is of a multi-layer type, i.e., comprising at least a first layer 2' and a second layer 2" coupled and vertically stacked on top of one another, made of different materials, preferably both metal, and having appropriate thicknesses (the same as or different from one another). In this case, the die 1 is coupled via die attach to the top surface 2a of the first layer 2', and the layer of coupling material 3 is interposed between the bottom surface 1a of the die and the aforesaid top surface 2a.

The advantage of this multi-layer embodiment is the availability of a further source of stresses, due to the different coefficient of thermal expansion CTE of the materials constituting the first and second layers 2', 2" of the support 2, which may represent an additional contribution that further increases the resulting stress $\sigma_s'$ acting on the die 1 at the operating temperature $T_o$.

Moreover, the use of a dedicated technique of brazing, at an appropriate brazing temperature, between the first and second layers 2', 2" of the support 2 may contribute to inducing a further stress, in particular a compressive stress, on the die 1.

Clearly, further layers for the multi-layer support 2 may possibly be provided.

Figure 8:
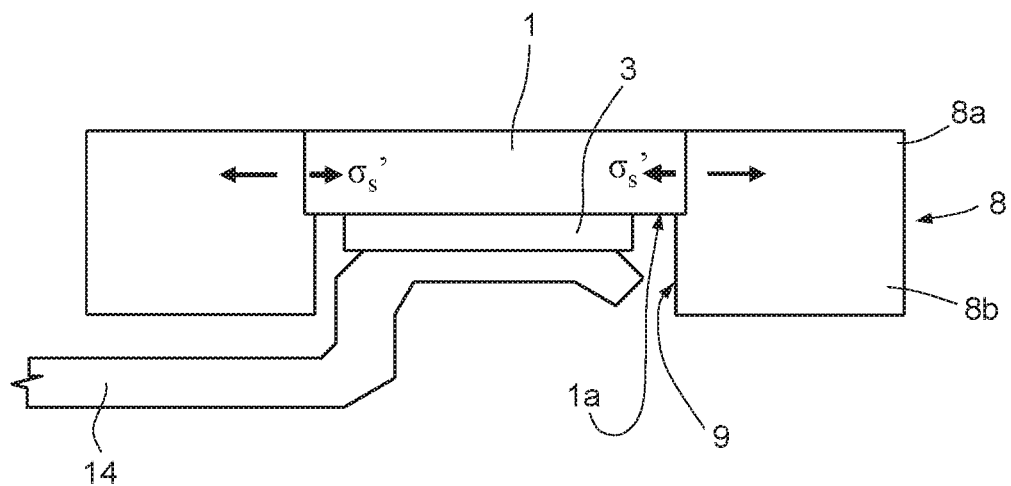

Yet a further variant embodiment, shown in FIG. 8, may envisage the presence of a rear-contact element 14, made of metal material, designed to be inserted in the cavity 9 defined inside the bottom portion 8b of the frame 8, and to be coupled, by means of die attach, to the bottom surface 1a of the die 1. This rear-contact element 14 may advantageously be connected, on the outside of the package of the semiconductor device, for example to a printed-circuit board (PCB).

The present solution in general finds advantageous application for any semiconductor device, whether a discrete device (for example, a power MOSFET, an IGBT, a VIPower, etc.) or an integrated circuit (for example, a microprocessor, a memory, a BCD device, an HCMOS device, etc.) and for any type of support 2 to which the die 1 of the semiconductor device is coupled (for example, a leadframe, a PCB, etc.).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A strained semiconductor device, comprising:
   a die of semiconductor material including integrated circuit components of the semiconductor device;
   a support coupled to the die and of a material different from said die;
   a housing structure forced-coupled in contact around said die and made of a material different from said die, said die being arranged in a housing opening defined in said housing structure; and
   a coupling material layer positioned between the die and the support and the coupling material layer between the housing structure and the support, the coupling material layer having an elastic modulus comprised between 40 GPa and 200 Gpa, and a Poisson's ratio comprised between 0.1 and 0.4.

2. The device according to claim 1, wherein the material of said housing structure is a metal, chosen from among aluminum, copper, and brass.

3. The device according to claim 1, wherein said housing opening has a substantially square or rectangular shape in top plan view, and said housing structure has, at corresponding corners, empty recesses of a substantially circular shape, which extend inside the housing structure at a distance from the die.

4. The device according to claim 1, wherein said housing structure is a frame having a top portion and a bottom portion, the top portion including the housing opening in which the die is positioned and the bottom portion includes a cavity that communicates with the housing opening and extends through a bottom surface of the frame;
   wherein the die is coupled to a projecting portion of said support that is positioned in said cavity.

5. The device according to claim 1, wherein said support includes a first layer and a second layer coupled to, and vertically stacked on top of, one another, and made of different materials; wherein said die is coupled to a top surface of the first layer of said support.

6. A strained semiconductor device, comprising:
   a die of semiconductor material, in which integrated circuit components of the semiconductor device are integrated;
   a support coupled to the die;
   a housing structure forced-coupled in contact around the die and of a material different from the die, the die being in a housing opening defined in the housing; and
   a coupling material layer between the die and the support and the coupling material layer between the housing structure and the support, the coupling material layer having an elastic modulus comprised between 40 GPa and 200 Gpa and a Poisson's ratio comprised between 0.1 and 0.4.

7. The device according to claim 6, wherein said housing opening has a substantially square or rectangular shape in top plan view, and said support has, at corresponding corners, empty recesses of a substantially circular shape, which extend inside the support at a distance from the die.

8. A strained semiconductor device, comprising:
   a support;
   a semiconductor die coupled to the support, the semiconductor die including integrated circuit components and having a first coefficient of thermal expansion, the support being of a material different from the die and having a second coefficient of thermal expansion that is different from the first coefficient of thermal expansion of the semiconductor die;
   a stress-inducing housing structure on a surface of the support, the housing structure including a housing opening, the semiconductor die being positioned in the housing opening, a sidewall surface of the housing opening abutting the semiconductor die; and a coupling material layer positioned between the die and the support and the coupling material layer between the housing structure and the support, the coupling material layer having an elastic modulus between 40 GPa and 200 Gpa, and a Poisson's ratio between 0.1 and 0.4.

9. The device according to claim 8 wherein the support includes one or more of aluminum, brass, or copper.

10. The device according to claim 8 wherein the stress-inducing housing structure introduces a compressive stress to the semiconductor die.

11. The device according to claim 8 wherein the housing structure includes one or more of aluminum, copper, and brass.

12. The device according to claim 8 wherein the semiconductor die and the housing structure are positioned on a surface portion of the support, the surface portion of the support having a substantially planar extension.

13. The device according to claim 8 wherein the housing structure is a frame having a top portion and a bottom portion, the top portion including the housing opening, and the bottom portion including a cavity that communicates with the housing opening and extends through a bottom surface of the frame.

14. The device according to claim 13 wherein the support includes a projection portion, the projection portion extending into the cavity of the bottom portion of the housing structure.

15. The device according to claim 13, comprising a contact structure that extends into the cavity and is electrically coupled to the semiconductor die.

16. The device of claim 15 wherein the contact structure is coupled to the semiconductor die via an attachment layer.

17. The device according to claim 8 wherein the support includes a first layer and a second layer coupled to, and vertically stacked on top of, one another, the first layer and the second layer being made of different materials.

18. The device according to claim 8 wherein the housing structure and the semiconductor die are both coupled to the support via a coupling layer in a first direction.

19. The device according to claim 18 wherein the housing structure and the semiconductor die are adjacent to one another only in a second direction that is transverse to the first direction.

* * * * *